(12) United States Patent
Guepratte et al.

(10) Patent No.: US 9,831,788 B2
(45) Date of Patent: Nov. 28, 2017

(54) ELECTRONIC CARD COMPRISING MAGNETIC ELEMENTS

(71) Applicant: THALES, Courbevoie (FR)

(72) Inventors: Kevin Guepratte, Elancourt (FR); Hervé Stephan, Elancourt (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 15/034,422

(22) PCT Filed: Nov. 21, 2014

(86) PCT No.: PCT/EP2014/075249
§ 371 (c)(1),
(2) Date: May 4, 2016

(87) PCT Pub. No.: WO2015/075172
PCT Pub. Date: May 28, 2015

(65) Prior Publication Data
US 2016/0276944 A1    Sep. 22, 2016

(30) Foreign Application Priority Data
Nov. 22, 2013 (FR) ...................... 13 02696

(51) Int. Cl.
*H02M 3/335* (2006.01)
*H01F 27/24* (2006.01)
(Continued)

(52) U.S. Cl.
CPC ........ *H02M 3/33576* (2013.01); *H01F 27/24* (2013.01); *H01F 27/2804* (2013.01);
(Continued)

(58) Field of Classification Search
CPC .... H02M 3/28; H02M 3/335; H02M 3/33523; H02M 3/33553; H02M 3/33576;
(Continued)

(56) References Cited

U.S. PATENT DOCUMENTS 5,027,255 A * 6/1991 Zeitlin ................. H01L 25/162
257/E25.03
6,307,458 B1 * 10/2001 Zhang ................. H01F 17/0006
336/200

(Continued)

FOREIGN PATENT DOCUMENTS

| DE | 297 15 106 U1 | 10/1997 |
|----|---------------|---------|
| EP | 1 037 221 A2  | 9/2000  |
| EP | 1 962 302 A1  | 8/2008  |

*Primary Examiner* — Fred E Finch, III
(74) *Attorney, Agent, or Firm* — Baker & Hostetler LLP

(57) ABSTRACT

An electronic board, in particular for a power electronics circuit such as a converter, comprises: a planar substrate having a first side and a second side opposite the first side; at least two magnetic core elements, called the first elements, arranged on the first side of the substrate and each having at least two legs passing through the substrate; and at least two windings, arranged around at least one leg of each first magnetic core; wherein: it also comprises a second magnetic core element in the form of a plate, arranged on the second side of the substrate and in contact with respective ends of the legs of at least two first elements; the first elements, the windings and the second element forming at least two mutually decoupled magnetic circuits.

11 Claims, 1 Drawing Sheet

(51) Int. Cl.
    *H05K 1/18*     (2006.01)
    *H05K 1/02*     (2006.01)
    *H05K 1/16*     (2006.01)
    *H02M 3/28*     (2006.01)
    *H01F 27/28*     (2006.01)

(52) U.S. Cl.
    CPC ............ *H02M 3/28* (2013.01); *H02M 3/335* (2013.01); *H05K 1/0233* (2013.01); *H05K 1/165* (2013.01); *H05K 1/181* (2013.01); *H01F 2027/2819* (2013.01); *H05K 2201/086* (2013.01)

(58) Field of Classification Search
    CPC ...... H01F 27/06; H01F 27/24; H01F 27/2804; H01F 2027/2819; H05K 1/18; H05K 1/181; H05K 1/183; H05K 1/165; H05K 1/0233; H05K 2201/083; H05K 2201/086
    See application file for complete search history.

(56) References Cited

U.S. PATENT DOCUMENTS

| | | | | |
|---|---|---|---|---|
| 2001/0020886 A1* | 9/2001 | Matsumoto | ............ | H01F 19/04 336/200 |
| 2002/0054480 A1* | 5/2002 | Jitaru | .................... | H01F 27/06 361/704 |
| 2002/0163818 A1* | 11/2002 | Green | ................. | H01F 27/2804 363/20 |
| 2004/0154757 A1* | 8/2004 | Osinga | ..................... | E06B 9/32 160/168.1 P |
| 2005/0110606 A1* | 5/2005 | Vinciarelli | .......... | H01F 27/2804 336/200 |
| 2005/0266730 A1* | 12/2005 | Lanni | ....................... | G06F 1/26 439/131 |
| 2006/0038650 A1* | 2/2006 | Mehrotra | ........... | H01F 27/2804 336/83 |
| 2008/0253149 A1* | 10/2008 | Matumoto | .......... | H01F 27/2804 363/21.06 |
| 2010/0141371 A1* | 6/2010 | Wang | .................. | H01F 17/0013 336/200 |
| 2010/0164670 A1* | 7/2010 | Nakahori | ........... | H01F 27/2804 336/200 |
| 2013/0027170 A1* | 1/2013 | Chen | .................. | H01F 27/2804 336/200 |
| 2013/0113596 A1* | 5/2013 | Li | ........................... | H01F 17/06 336/212 |
| 2014/0169042 A1* | 6/2014 | Eguchi | ................ | H02M 3/3353 363/21.06 |
| 2015/0221432 A1* | 8/2015 | Zhou | ...................... | H02J 5/005 361/679.01 |
| 2016/0358705 A1* | 12/2016 | Lin | ......................... | H01F 27/06 |

* cited by examiner

ELECTRONIC CARD COMPRISING MAGNETIC ELEMENTS

CROSS-REFERENCE TO RELATED APPLICATIONS

This application is a National Stage of International patent application PCT/EP2014/075249, filed on Nov. 21, 2014, which claims priority to foreign French patent application No. FR 1302696, filed on Nov. 22, 2013, the disclosures of which are incorporated by reference in their entirety.

FIELD OF THE INVENTION

The invention pertains to an electronic board comprising at least two magnetic elements. The invention mainly relates to the field of power electronics, and more specifically to that of onboard power electronics circuits, in particular for aeronautical applications.

BACKGROUND

Power electronics circuits, such as DC/DC or AC/DC voltage converters, generally comprise magnetic components—coils and capacitors. By way of example, FIG. 1 shows the circuit diagram of a DC/DC converter CCC comprising a half-bridge inverter O, a full-bridge active rectifier R, a transformer T whose primary winding is linked to the inverter O and whose secondary winding is linked to the rectifier R, and a coil B that is connected in series with said secondary winding but magnetically decoupled from said transformer. These magnetic components (T, B)—and more specifically their magnetic (actually, ferromagnetic) cores—greatly contribute to the bulk of the circuit. Yet, bulk constitutes a major constraint, in particular in onboard—and more specifically aeronautical—applications where the available space is very limited.

It is known practice to implement power electronics circuits in the form of electronic boards comprising a planar printed circuit board substrate bearing surface-mount electrical and electronic components. In these electronic boards, the magnetic components are implemented using planar technology: the windings are formed by the deposition of tracks on one or both sides of the printed circuit board substrate and each magnetic core is composed of a first "E-shaped" (with three legs) or "U-shaped" (with two legs) element, and of a second "I-shaped" (without legs, i.e. plate- or strip-shaped) element closing the magnetic circuit. The first elements are arranged on a first side, called the front side, of the substrate; the second elements are arranged on a second side, called the back side, of the substrate; and the legs pass through the substrate by virtue of through-holes made in the latter. This technique allows the bulk of the magnetic components to be kept down; nevertheless, the thickness of the cores remains relatively significant. Specifically, magnetic circuit theory indicates that the magnetic flux inside a core is inversely proportional to its reluctance, which is itself inversely proportional to its cross section, and hence to its thickness. The requirement to ensure a determined magnetic flux, for a given magnetomotive force, therefore imposes a minimum thickness for the elements forming the magnetic cores.

SUMMARY OF THE INVENTION

The invention aims to overcome this drawback of the prior art and to provide integrated circuit boards comprising magnetic elements that have a reduced bulk, and more specifically a low thickness.

The subject of the invention, allowing this goal to be achieved, is an electronic board comprising: a planar substrate having a first side and a second side opposite said first side; at least two magnetic core elements, called the first elements, arranged on said first side of said substrate and each having at least two legs passing through said substrate; and at least two windings, arranged around at least one leg of each said first magnetic core; characterized in that: it also comprises a second magnetic core element in the form of a plate, arranged on said second side of said substrate and in contact with respective ends of said legs of said or at least two said first elements; and in that: the spacing between said first elements is sufficient to prevent any mutual magnetic coupling via said second element; whereby said first elements, said windings and said second element form at least two mutually decoupled magnetic circuits.

According to particular embodiments of the invention:
Said planar substrate may be a printed circuit board substrate.
Said windings may be planar windings, formed by the deposition of conductive tracks on said planar substrate.
Said electronic board may comprise a power electronics circuit that is implemented on said substrate and that includes said mutually decoupled magnetic circuits. In particular, said power electronics circuit may be a DC/DC or AC/DC converter. At least one said first magnetic core element may be an "E-shaped" type element forming, with two said windings and said second magnetic core element, a transformer, and at least one other said first magnetic core element is a "U-shaped" type element forming, with one said winding and said second magnetic core element, a coil. In this case, said coil may be connected in series with a winding of said transformer.
Said second side of said substrate may bear at least one electric or electronic component, the height of said second magnetic core element, with respect to said second side, being less than or equal to that of said component, or of the component having the greatest height.
Said power electronics circuit may be implemented using surface-mount technology.
Said second magnetic core element may have a magnetic permeability that is greater by at least a factor 10, and preferably by at least a factor 100, than that of said first magnetic core elements.

BRIEF DESCRIPTION OF THE DRAWINGS

Other features, details and advantages of the invention will become apparent upon reading the description made with reference to the appended drawings that are given by way of example and which show, respectively.

DETAILED DESCRIPTION

An idea behind the present invention consists in using, on the back side of the printed circuit board substrate, an "I-shaped" magnetic core element in the form of a plate, common to multiple, separate and mutually decoupled, magnetic circuits and hence to multiple first core elements arranged on the front side of said substrate. This allows the magnetic field lines to be spread over a larger area, decreasing the reluctance of the magnetic circuit for a given thickness of the core element in the form of a plate. This in turn allows this thickness, and hence the thickness of the electronic board, to be reduced for a given reluctance value. Furthermore, the presence of a metal plate on the back side of the printed circuit board substrate facilitates the dissipation of heat. Additionally, assembly operations are simplified, as there are fewer separate magnetic elements to put in place.

Figure 1:
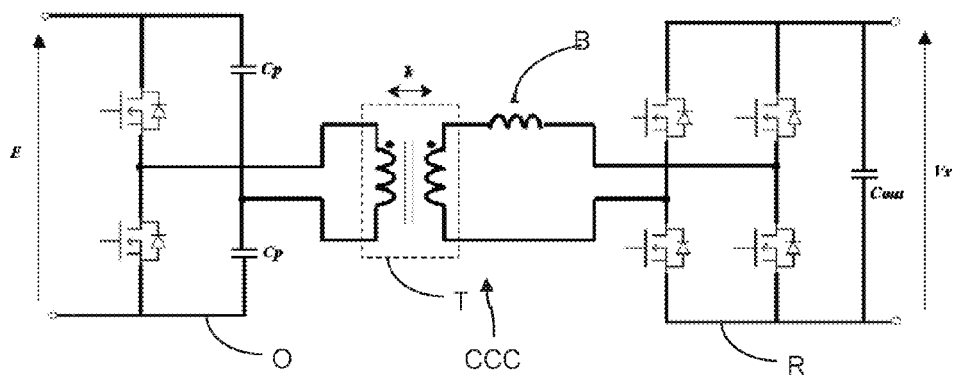
FIG. 1 shows the circuit diagram of a DC/DC converter.
Figure 2:
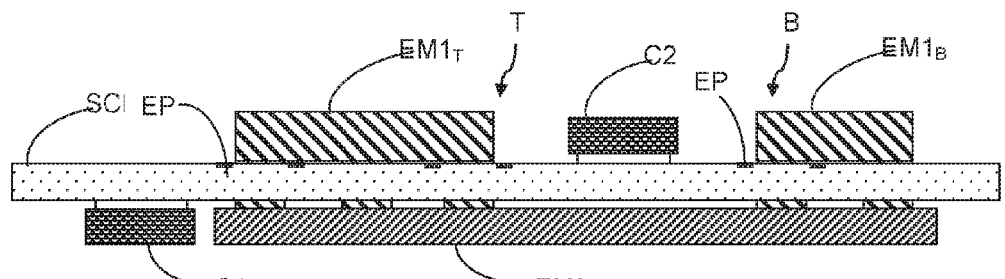
FIG. 2, a side view of an electronic board according to one embodiment of the invention.

FIG. 2 (not to scale) illustrates, in a highly schematic manner, an electronic board implementing the invention. This board is composed of a two-sided printed circuit board substrate, SCI, bearing a plurality of interconnected electrical, electronic and magnetic components in order to produce the circuit of FIG. 1. For the sake of simplification, only two surface-mount integrated circuits, C1 (mounted on the back side of the substrate SCI) and C2 (mounted on the front side), a transformer T and a coil B are shown, these being produced in planar technology.

The transformer T comprises a first magnetic core element $EM1_T$, made of ferrite for example, of "E-shaped" type, i.e. having three legs. The element $EM1_T$ is arranged on the front side of the substrate SCI, with its legs passing through said substrate to emerge on the back side. The primary and secondary windings are planar, i.e. composed of tracks deposited on at least one side of the substrate (here, the front side); they are denoted by the reference EP.

The coil B comprises a first magnetic core element $EM1_B$, made of ferrite for example, of "U-shaped" type, i.e. having two legs. The element $EM1_B$ is also arranged on the front side of the substrate SCI, with its legs passing through said substrate to emerge on the back side. A single planar winding EP is provided, around one of the two legs.

The closure of the two magnetic circuits is ensured by a shared magnetic core element, EM2, that forms a plate borne by the back side of the substrate SCI, in contact with the ends of the legs of the first elements $EM1_T$ and $EM1_B$.

Figure 3:
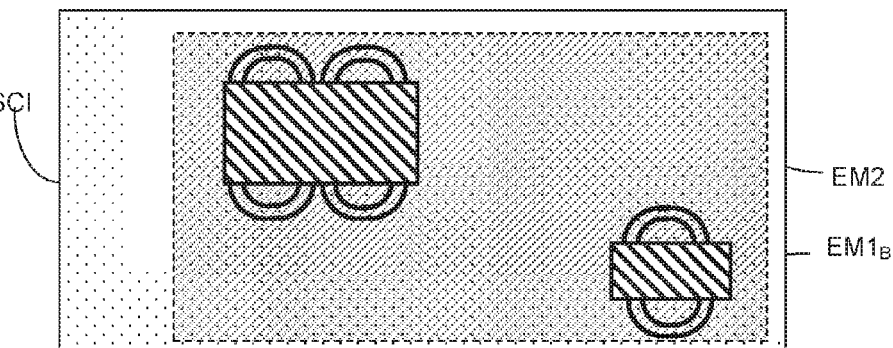
FIG. 3, a transparent plan view of the electronic board of FIG. 2, highlighting the magnetic field lines inside the second magnetic core element.
Figure 4:
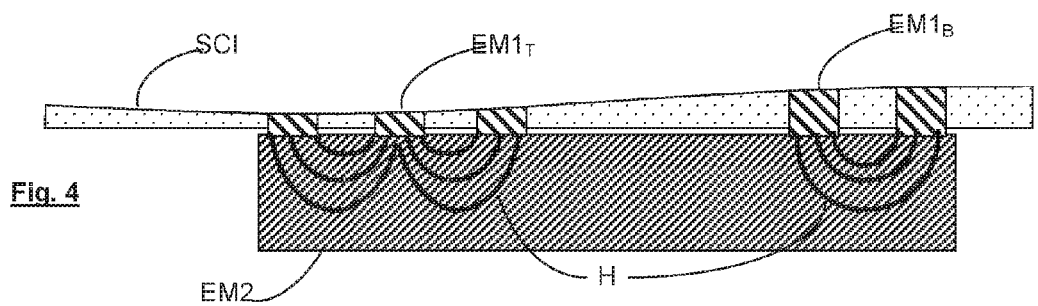
FIG. 4, a cross-sectional detail view of the electronic board of FIG. 2, highlighting the magnetic field lines inside the second magnetic core element.

FIGS. 3 and 4 (which are not to scale and which, for the sake of simplicity, do not show the components C1 and C2) allow the magnetic field lines H inside the shared magnetic core EM2, when the windings EP are supplied with current, to be seen. FIG. 3, in particular, shows that the magnetic field lines extend laterally beyond the footprints of the first core elements $EM1_T$ and $EM1_B$, but not enough to induce significant magnetic coupling between the coil and the transformer. This means that the shared core element behaves like a pair of separate core elements, having an "effective width" that is greater than that of the first elements $EM1_T$ and $EM1_B$. As mentioned above, this allows its thickness to be reduced, with respect to a conventional case in which the second core element of each magnetic circuit has a footprint that is equal to that of the corresponding first core element, without increasing its reluctance. Advantageously, this thickness will at most be equal to that of the electronic component mounted on the back side and having the greatest height with respect to said side (C1, in the example of FIG. 2).

In the design phase, it will be necessary to ensure that the first core elements are sufficiently distant from one another so that, effectively, there is no magnetic coupling between the various magnetic circuits. This may be ensured by means of computer simulations. By way of indication, the magnetic coupling between two magnetic circuits may be considered to be negligible if the mutual inductance between two windings of two different circuits is smaller by at least a factor 100, or even a factor 1000, than the self-inductance of each of these windings.

In order to reduce the parasitic magnetic couplings that might potentially persist, it is possible to use a second core element EM2 that has a magnetic permeability that is greater by a factor 100, or even a factor 1000, than that of the first elements $EM1_T$, $EM1_B$. This has the effect of "tightening" the magnetic field lines.

The invention has been described with reference to a particular embodiment, given by way of non-limiting example, but it provides scope for numerous variants. In particular:

The electronic board may implement an electronic circuit other than the converter shown in FIG. 1, or even a plurality of separate circuits.

The magnetic circuits sharing one and the same second core element may be more than two in number, and have more than two or three legs.

One and the same electronic board may have a plurality of second core elements, each associated with a plurality of respective first elements.

The designation of one side of the substrate as "the front side" or "the back side" is arbitrary. The conductive tracks and the electrical or electronic components may be arranged on only one of the two sides, or on both thereof.

It is not essential that the substrate is a printed circuit board substrate, that the electronic circuit or circuits are implemented using surface-mount technology and/or that the windings are of planar type.

Any ferromagnetic material may be suitable for the production of the core elements.

The invention claimed is:

1. An electronic board comprising:
a planar substrate having a first side and a second side opposite said first side;
at least a first magnetic core element and a second magnetic core element arranged on said first side of said substrate and each of said first magnetic core element and second magnetic core element having at least two legs passing through said substrate; and
at least two windings, arranged around at least one leg of each of said first magnetic core element and said second magnetic core element;
a third magnetic core element in the form of a plate, arranged on said second side of said substrate and in contact with respective ends of said at least one leg of said first magnetic core element and said second magnetic core element;
wherein a spacing between said first magnetic core element and said second magnetic core element prevents mutual magnetic coupling via said third magnetic core element;
whereby said first magnetic core element and said second magnetic core element, said at least two windings and said third magnetic core element form at least two mutually decoupled magnetic circuits.

2. The electronic board of claim 1, wherein said planar substrate is a printed circuit board substrate.

3. The electronic board of claim 2, wherein said windings are planar windings, formed by the deposition of conductive tracks on said planar substrate.

4. The electronic board of claim 1, comprising a power electronics circuit that is implemented on said substrate and that includes said mutually decoupled magnetic circuits.

5. The electronic board of claim 4, wherein said power electronics circuit is a DC/DC or AC/DC converter.

6. The electronic board of claim 4, wherein at least one of said first magnetic core element and said second magnetic core element is an "E-shaped" type element forming, with two said at least two windings and said third magnetic core element, a transformer, and at least one other of said first magnetic core element and said second magnetic core element is a "U-shaped" type element forming, with one of said at least two windings and said third magnetic core element, a coil.

7. The electronic board of claim 6, wherein said coil is connected in series with a winding of said transformer.

8. The electronic board of claim 4, wherein said second side of said substrate bears at least one electric or electronic component, a height of said third magnetic core element, with respect to said second side, being less than or equal to a height of said component.

9. The electronic board of claim 4, wherein said power electronics circuit is implemented using surface-mount technology.

10. The electronic board of claim 1, wherein said third magnetic core element has a magnetic permeability that is greater by at least a factor of 10 than that of said first magnetic core element and said second magnetic core element.

11. The electronic board of claim 1, wherein said third magnetic core element has a magnetic permeability that is greater by at least a factor of 100 than that of said first magnetic core element and said second magnetic core element.

* * * * *